United States Patent
Luo

(10) Patent No.: US 10,983,642 B2
(45) Date of Patent: Apr. 20, 2021

(54) USING DRIVEN SHIELD AND TOUCH ELEMENTS LOCK ALGORITHM FOR ACHIEVING LIQUID TOLERANT CAPACITIVE TOUCH SOLUTION

(71) Applicant: TEXAS INSTRUMENTS INCORPORATED, Dallas, TX (US)

(72) Inventor: Yiding Luo, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 16/511,943

(22) Filed: Jul. 15, 2019

(65) Prior Publication Data

US 2020/0033969 A1 Jan. 30, 2020

Related U.S. Application Data

(60) Provisional application No. 62/712,106, filed on Jul. 30, 2018.

(51) Int. Cl.
| | | |
|---|---|---|
| *G06F 3/044* | (2006.01) | |
| *H05K 5/06* | (2006.01) | |
| *G07C 9/00* | (2020.01) | |
| *G06F 3/041* | (2006.01) | |
| *H03K 17/96* | (2006.01) | |

(52) U.S. Cl.
CPC ............ *G06F 3/044* (2013.01); *G06F 3/0416* (2013.01); *G07C 9/00674* (2013.01); *H05K 5/065* (2013.01)

(58) Field of Classification Search
USPC ....................................................... 345/174
See application file for complete search history.

(56) References Cited

U.S. PATENT DOCUMENTS

| | | | | |
|---|---|---|---|---|
| 8,982,097 | B1* | 3/2015 | Kuzo | G06F 3/04186 345/174 |
| 9,576,179 | B2 | 2/2017 | Bae et al. | |
| 2004/0188151 | A1* | 9/2004 | Gerpheide | G06F 3/0446 178/18.01 |
| 2010/0315363 | A1* | 12/2010 | Kobayashi | G06F 3/04166 345/173 |

(Continued)

FOREIGN PATENT DOCUMENTS

CN 103271739 9/2013

OTHER PUBLICATIONS

PCT Search Report dated Nov. 7, 2019.
TI Designs: TIDM-1021 "Liquid Tolerant Capacitive Touch Keypad Design", Jul. 2018, pp. 1-28.

*Primary Examiner* — Chineyere D Wills-Burns
(74) *Attorney, Agent, or Firm* — Brian D. Graham; Charles A. Brill; Frank D. Cimino

(57) ABSTRACT

An apparatus includes a touch interface that includes a plurality of electrodes and a shield device. The shield device is configured to establish a first mutual capacitive coupling with a first electrode of the plurality of electrodes. The shield device is further configured to establish a second mutual capacitive coupling with a second electrode of the plurality of electrodes. The apparatus further includes a controller coupled to the touch interface. The controller is configured to detect a touch based on a detected first capacitance value of the first mutual capacitive coupling and a detected second capacitance value of the second mutual capacitive coupling.

17 Claims, 3 Drawing Sheets

(56) References Cited

U.S. PATENT DOCUMENTS

| | | | | |
|---|---|---|---|---|
| 2012/0268411 | A1* | 10/2012 | Chen | G06F 3/0416 |
| | | | | 345/174 |
| 2013/0076375 | A1* | 3/2013 | Hanumanthaiah | H03K 17/975 |
| | | | | 324/661 |
| 2013/0207935 | A1* | 8/2013 | Toda | G06F 3/044 |
| | | | | 345/174 |
| 2014/0104188 | A1* | 4/2014 | Bakken | G06F 3/0441 |
| | | | | 345/173 |
| 2015/0002431 | A1* | 1/2015 | Lee | G06F 3/0488 |
| | | | | 345/173 |
| 2015/0091842 | A1* | 4/2015 | Shepelev | G06F 3/04184 |
| | | | | 345/174 |
| 2015/0130742 | A1* | 5/2015 | Chen | G06F 3/0445 |
| | | | | 345/174 |
| 2016/0266717 | A1* | 9/2016 | Oral | G06F 3/0418 |
| 2017/0052625 | A1* | 2/2017 | Bryant | G06F 3/04186 |
| 2017/0201254 | A1* | 7/2017 | Hanssen | G01R 27/2605 |
| 2018/0005030 | A1 | 1/2018 | Jiang et al. | |
| 2018/0011596 | A1* | 1/2018 | Korapati | G06F 3/04186 |

\* cited by examiner

USING DRIVEN SHIELD AND TOUCH ELEMENTS LOCK ALGORITHM FOR ACHIEVING LIQUID TOLERANT CAPACITIVE TOUCH SOLUTION

CROSS-REFERENCE TO RELATED APPLICATIONS

This application claims priority to U.S. Provisional Application No. 62/712,106, filed Jul. 30, 2018, which is hereby incorporated by reference.

BACKGROUND

Capacitive touch detection techniques are used many touch driven devices, such as touch screens and keypads. Such a touch driven device includes a plurality of sensors and detects a tooth location based on measured changes in capacitance of the sensors. For example, a user's finger near a sensor may cause the capacitance of one of the plurality of sensors to increase or decrease resulting in the touch driven device detecting a touch at the location of the sensor. However, liquid present on a surface of a capacitive touch sensor may interfere with touch detection. For example, liquid present on the surface of the capacitive touch sensor may establish an electrical connection between a first sensor and a second sensor such that a user touching the first sensor may affect capacitance of both the first sensor and the second sensor. In addition, liquid present on the capacitive touch sensor may establish an electrical connection between a sensor and a surrounding ground component of the capacitive touch sensor system causing the sensor to change capacitance and the touch device to incorrectly detect a user touch.

SUMMARY

In some examples, a touch device includes a controller and a touch interface that includes a plurality of electrodes (e.g., sensors) and a driven shield. The controller is coupled to each of the plurality of electrodes and is configured to detect capacitance changes over time. The driven shield surrounds the plurality of electrodes in a plane such that the driven shield is located between each of the plurality of electrodes and each other of the plurality of electrodes. The driven shield and the plurality of electrodes are configured to be driven to a common voltage (e.g., a reference voltage).

In mutual mode implementations, the controller is coupled to the driven shield and to each of the plurality of electrodes. The driven shield is configured to function as a mutual mode transmitter for each of the plurality of electrodes, which operate as mutual mode receivers. Using the driven shield as the transmitter for each of the receivers reduces a number of input/output connections between the touch interface and the controller as compared to implementations in which each of the receivers has a corresponding unique transmitter.

In both mutual mode and self mode implementations, the driven shield may reduce cross coupling effects amongst the plurality of electrodes. Reduced cross coupling may cause capacitance differences between touched and untouched electrodes to be greater. Accordingly, the controller may use a higher threshold to determine whether a touch has occurred as compared to implementations that lack a driven shield. Such a higher threshold may reduce false positive touch detections caused by the presence of liquid. Further, because the driven shield is not kept at ground, liquid may be prevented from coupling the plurality of electrodes to ground and causing capacitance changes. Accordingly, the driven shield may increase reliability of a touch device in the presence of liquid.

The controller is configured to monitor capacitance changes in capacitance associated with the plurality of electrodes and detect touches accordingly.

In some examples, the controller is configured to set a touch detection threshold based on whether liquid is detected on the touch interface. By using an elevated threshold in response to detecting liquid on the touch interface, the controller may prevent false positives caused by water flowing across the touch interface.

In some examples, the controller is configured to select an electrode as a detected touched electrode in response to determining that a change in capacitance associated with the electrode is greater than detected changes in capacitance associated with other electrodes of the touch interface. Selecting the electrode associated with the greatest detected change in capacitance may reduce the likelihood of the controller selecting an electrode associated with a capacitance change caused by water flowing across the touch interface. For example, water flowing across the touch interface may couple a user's finger to one or more electrodes but an electrode closest to a user's finger may be associated with a greater capacitance change compared to other electrodes of the touch interface. Accordingly, selecting the electrode associated with the greatest detected change may improve accuracy of touch detection.

In some examples, the controller is configured to, in response to detection of a touch corresponding to a one of the electrodes, lock the touch interface. For example, the controller may lock detection to "1" in response to detecting a touch corresponding to an electrode associated with a "1" key. While the controller is locked to the particular value, the controller ignores capacitance changes indicating touches corresponding to other ones of the plurality of electrodes. For example, while the touch interface is locked, the controller may not output "2" despite detecting capacitance changes corresponding to an electrode associated with a "2" key. The controller maintains the lock until the controller detects a capacitance change indicating that the one of the plurality of electrodes is no longer touched. Locking the touch interface may prevent the controller from falsely reporting touches corresponding to other ones of the plurality of electrodes while a user touches the particular one of the plurality of electrodes and water dynamically flows across the touch device establishing electrical connections between the user and other ones of the plurality of electrodes.

In some examples, an apparatus includes a touch interface that includes a plurality of electrodes and a shield device. The shield device is configured to establish a first mutual capacitive coupling with a first electrode of the plurality of electrodes. The shield device is further configured to establish a second mutual capacitive coupling with a second electrode of the plurality of electrodes. The apparatus further includes a controller coupled to the touch interface. The controller is configured to detect a touch based on a detected first capacitance value of the first mutual capacitive coupling and a detected second capacitance value of the second mutual capacitive coupling.

In some examples, a method includes determining, at a controller, whether liquid is present on a touch interface. The method further includes setting a touch detection threshold based on the determination of whether liquid is present on the touch interface. The method further includes determining that the touch interface has been touched in response to determining that a change in capacitance associated with an electrode of a plurality of electrodes satisfying the touch detection threshold.

In some examples, a computer readable storage device stores instructions executable by one or more processors to determine, at a controller, whether liquid is present on a touch interface. The instructions are further executable by the one or more processors to set a touch detection threshold based on the determination of whether liquid are present on the touch interface. The instructions are further executable by the one or more processors to determine that the touch interface has been touched in response to determining that a change in capacitance associated with an electrode of a plurality of electrodes satisfying the touch detection threshold.

BRIEF DESCRIPTION OF THE DRAWINGS

For a detailed description of various examples, reference will now be made to the accompanying drawings in which.

DETAILED DESCRIPTION

Figure 1:
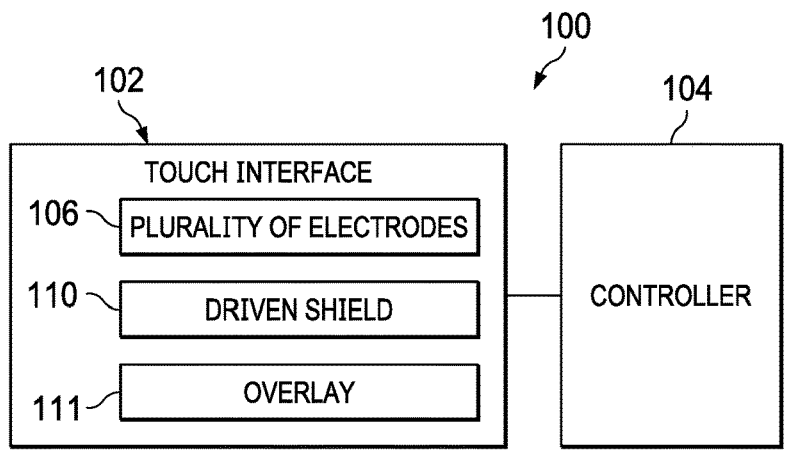
FIG. 1 is a block diagram of a touch detection system that includes a driven shield.

Capacitive touch devices and methods that may be more resilient to the presence of liquids are disclosed. Referring to FIG. 1, a block diagram of a touch detection system 100 is shown. The touch detection system 100 includes a touch interface 102 coupled to a controller 104. The touch interface 102 includes a plurality of electrodes 106 and a driven shield 110. The driven shield 110 may include an electrode. In some implementations, the plurality of electrodes and the driven shield 110 correspond to traces or pads on a printed circuit board (PCB). The controller 104 may be included on the same PCB as the touch interface 102. In the illustrated example, the touch interface 102 further includes an overlay 111. The overlay 111 may correspond to a layer located adjacent to the plurality of electrodes 106 and the driven shield 110. The overlay 111 may include plastic or another material and may include touch buttons corresponding to the plurality of electrodes 106.

The controller 104 corresponds to a microcontroller or other processing device configured to perform operations described herein. The controller 104 is configured to drive the driven shield 110 to a reference voltage and to charge the plurality of electrodes 106. The controller 104 may further drive the plurality of electrodes 106 to the reference voltage. In mutual mode examples, the driven shield 110 acts as a transmitter while the plurality of electrodes 106 acts as receivers, and mutual capacitive couplings are created between the driven shield 110 and the plurality of electrodes 106. Thus, in mutual mode examples, each of the plurality of electrodes 106 forms a capacitance sensor with the driven shield 110. In self-mode examples, each of the plurality of electrodes 106 corresponds to a capacitance sensor.

The controller 104 is configured to detect changes in capacitance values associated with the plurality of electrodes 106. In mutual mode examples, a capacitance value associated with an electrode corresponds to a mutual capacitance between that electrode and the driven shield 110. In self mode examples, the capacitance value associated with the electrode corresponds to a capacitance of the electrode. In an illustrative example, the controller 104 is configured to detect a capacitance change associated with one of the plurality of electrodes 106 by counting a number of charge cycles the electrode uses to charge a reference capacitor to a reference capacitance.

In operation of mutual mode examples, the controller 104 monitors changes in capacitance values of mutual capacitance couplings between the plurality of electrodes 106 and the driven shield 110 and detects touches based on a comparison of detected changes to a threshold. For example, the controller 104 may determine that a user has touched one of the touch buttons of the overlay 111 based on a capacitance change in mutual capacitance between the driven shield 110 and one of the plurality of electrodes 106 corresponding to the button. The change in mutual capacitance may correspond to a change in mutual capacitance between the electrode and the driven shield 110 (e.g., in mutual mode examples) between a charge phase and a transfer phase. In mutual mode examples, the controller 104 may detect a touch in response to detecting a decrease in mutual capacitance that satisfies the threshold. In operation of self mode examples, the controller 104 monitors changes in capacitance values of the plurality of electrodes 106 and detects touches based on a comparison of detected changes to a threshold. For example, the controller 104 may determine that a user has touched one of the touch buttons of the overlay 111 based on a capacitance change in a corresponding one of the plurality of electrodes 106. In self-mode examples, the controller 104 may detect a touch in response to detecting an increase in capacitance that satisfies the threshold. The arrangement of the driven shield 110 may reduce an occurrence of incorrect touch detections generated by the controller 104 (in both mutual mode and self mode examples) when liquid is present on a surface of the touch interface 102 as described further below.

Figure 2:
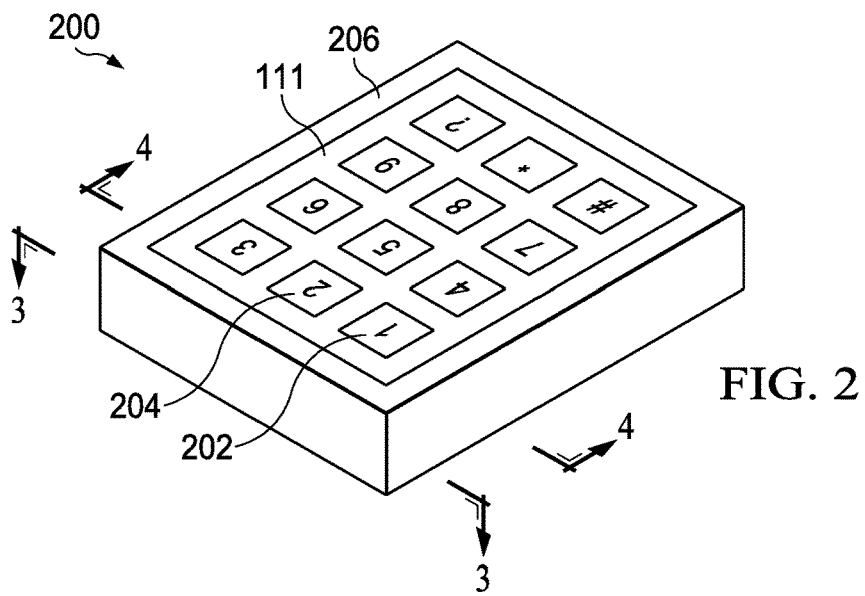
FIG. 2 is a diagram of a touch device that includes the touch detection system.

Referring to FIG. 2, a diagram of an example touch device 200 that includes the touch detection system 100 is shown. In the illustrated example, the overlay 111 corresponds to a touch surface embedded in a case 206. The case 206 may include plastic or another material. The touch surface includes twelve touch buttons, including a first button 202 and a second button 204. In some implementations, the touch device 200 is configured to control an electronic lock system. For example, the controller 104 may be configured to engage and disengage an electronic lock based on touches detected on the touch interface 102. Alternatively, the controller 104 may be configured to signal a separate electronic lock controller based on touches detected on the touch interface 102. In some examples, the overlay 111 may include a different number of touch buttons than depicted or may correspond to a touch screen.

Figure 3:
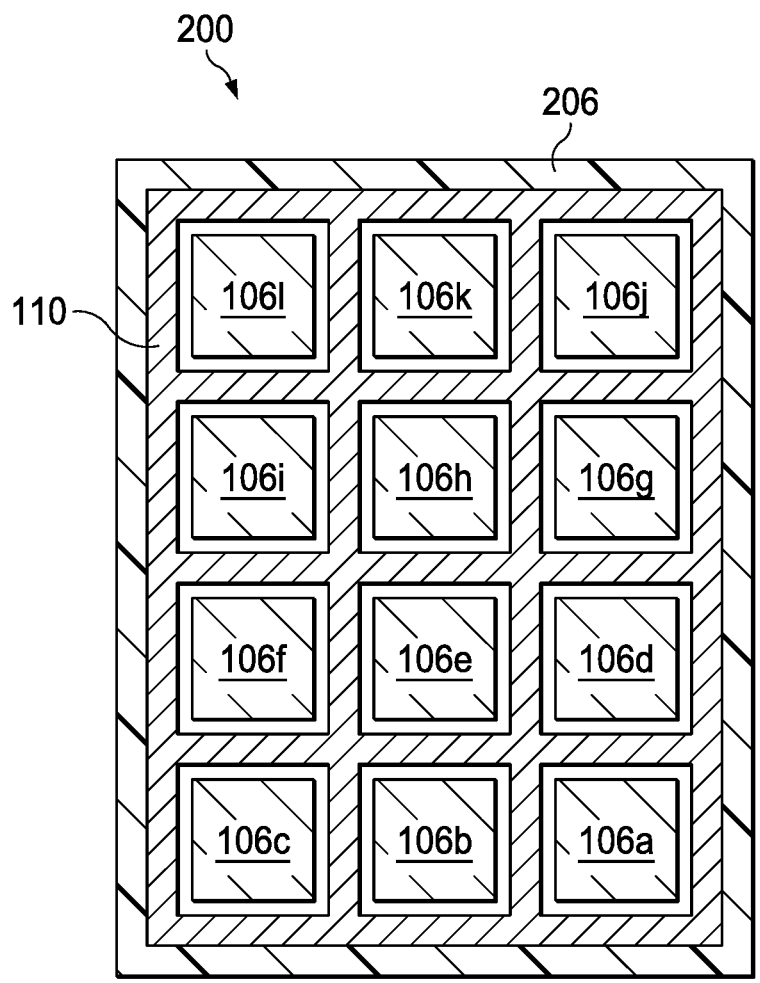
FIG. 3 is a first sectional view of the touch device depicting an arrangement of the driven shield and electrodes in a plane.

FIG. 3 illustrates a first cross sectional view of the touch device 200 showing the driven shield 110 and the plurality of electrodes 106. Each of the plurality of electrodes 106 corresponds to one of the plurality of buttons (e.g., mutual mode or self mode capacitance buttons) of the overlay 111. For example, a first electrode 106a corresponds to the first button 202 and a second electrode 106b corresponds to the second button 204. In a plane illustrated in FIG. 3, the driven shield 110 surrounds the each of the plurality of electrodes 106 and is located between each of the plurality of electrodes 106 and each other of the plurality of electrodes 106. For example, the driven shield 110 surrounds the first electrode 106a and the second electrode 106b and is located between the first electrode 106a and the second electrode 106b. As described above, the controller 104 is configured to drive the driven shield 110 to a reference voltage and to charge the plurality of electrodes 106. The controller 104 may further drive the plurality of electrodes 106 to the reference voltage. Accordingly, signals that drive the plurality of electrodes 106 and the driven shield 110 may have similar or the same waveforms. Because the driven shield 110 is located between each of the plurality of electrodes 106 and each other of the plurality of electrodes 106, the electric field generated by the driven shield 110 may reduce cross coupling of the plurality of electrodes 106.

Cross coupling may occur through the air or through liquid present on the overlay 111. For example, liquid flowing on a surface of the overlay 111 between the first button 202 and the second button 204 may electrically couple the first electrode 106a and the second electrode 106b. Cross coupling between the first electrode 106a may cause factors that affect a capacitance associated with the first electrode 106a (e.g., a touch) to also affect capacitance associated with the second electrode 106b. The electric field generated by the driven shield 110 may reduce cross coupling between the first electrode 106a and the second electrode 106b even when liquid is flowing between the first button 202 and the second button 204. Reducing cross coupling between the first electrode 106a and the second electrode 106b may increase a difference in capacitance changes associated with the two electrodes 106a, 106b resulting from a user's finger touching the first button 202. Therefore, the controller 104 may more easily discern that the touch corresponds to the first button 202 rather than the second button 204 as compared to systems that lack a driven shield.

Further, the placement of the driven shield 110 may prevent liquid from coupling the plurality of electrodes 106 with ground (or a voltage different from a voltage of the plurality of electrodes 106). To illustrate, examples of touch interfaces may include a grounded element surrounding the first electrode 106a. In such examples, liquid present on the touch interface may couple an electrode with the grounded element resulting in a change in capacitance associated with the electrode. This may cause a touch associated with the electrode to be detected even when no finger is present on the touch interface. In contrast, liquid flowing from the first button 202 to another portion of the overlay 111 may not couple the first electrode 106a to ground because the driven shield 110 and the first electrode 106a are driven to the same reference voltage. Thus, the driven shield 110 may further reduce a chance that the controller 104 falsely detects a touch has occurred as a result of liquid present on the touch interface 102.

In mutual mode examples, the controller 104 is configured to operate each of the electrodes of the plurality of electrodes 106 as mutual mode receivers and to drive the driven shield 110 as a mutual mode transmitter for each of the plurality of electrodes 106. In an illustrative example, the controller 104 drives the plurality of electrodes 106 and the driven shield 110 to establish a first mutual capacitive coupling between the first electrode 106a and the driven shield 110 and a second mutual capacitive coupling between the second electrode 106b and the driven shield 110. The controller is configured to monitor a first capacitance value of the first mutual capacitive coupling and a second capacitance value of the second mutual capacitive coupling to determine whether one of the first button 202 or the second button 204 has been touched. In some implementations, each of the electrodes 106 has a corresponding discrete connection to the controller 104. Accordingly, the controller 104 may more accurately detect touches in the presence of liquid as compared to systems in which a controller receives a multiplexed signal from a group of transmitters. Because the driven shield 110 is used as a transmitter for both the first electrode 106a and the second electrode 106b, there may be fewer connections to the controller 104 from transmitters as compared to mutual mode touch sensor systems that use a unique transmitter for each receiver. Accordingly, the controller 104 may include fewer input/output pins dedicated to transmitters as compared to controllers used in other systems.

In addition, liquid located on the touch interface 102 may increase electric field coupling between one of the electrodes 106 and the driven shield 110 (e.g., because liquid has a higher dielectric constant than air). Accordingly, liquid present on the touch interface 102 may increase mutual capacitance between one of the electrodes 106 and the driven shield 110. As described above, the controller 104 may detect touches based on decreases in mutual capacitance. Accordingly, the driven shield 110 may reduce false positives for at least this additional reason.

Figure 4:
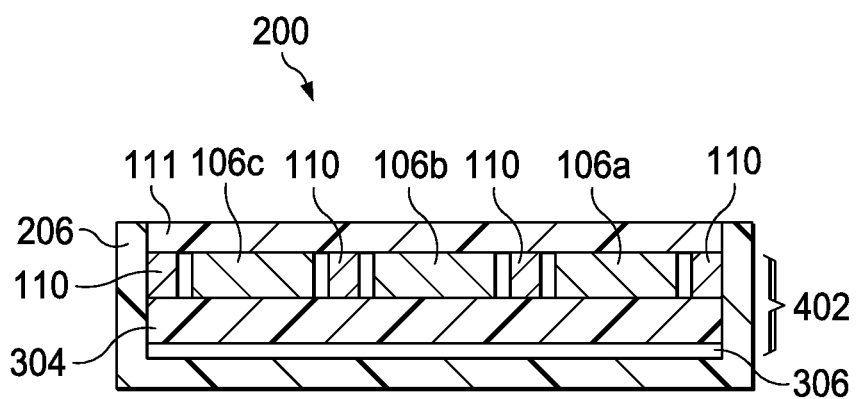
FIG. 4 is a second sectional view of the touch device depicting an arrangement of the driven shield and electrodes in second plane.

FIG. 4 illustrates a second cross sectional view of the touch device 200. In the illustrated example, the plurality of electrodes 106 and the driven shield 110 correspond to traces or pads of a PCB 402. The plurality of electrodes 106 and the driven shield 110 are embedded in a PCB core layer 304 which is adjacent to a ground layer 306. The PCB core layer 304 may include a composite material such as an FR-4 material. The ground layer 306 may include copper foil coupled to a ground point. While not illustrated, the controller 104 may be located on the PCB 402 as well. As illustrated, the driven shield 110 is located between the plurality of electrodes 106. For example, the driven shield 110 is located between the first electrode 106a and the second electrode 106b. Accordingly, the electric field of the driven shield 110 may reduce cross coupling effects caused by liquid flowing across the overlay 111. Further, the driven shield 110 may prevent liquid from coupling one of the plurality of electrodes 106 to ground.

Figure 5:
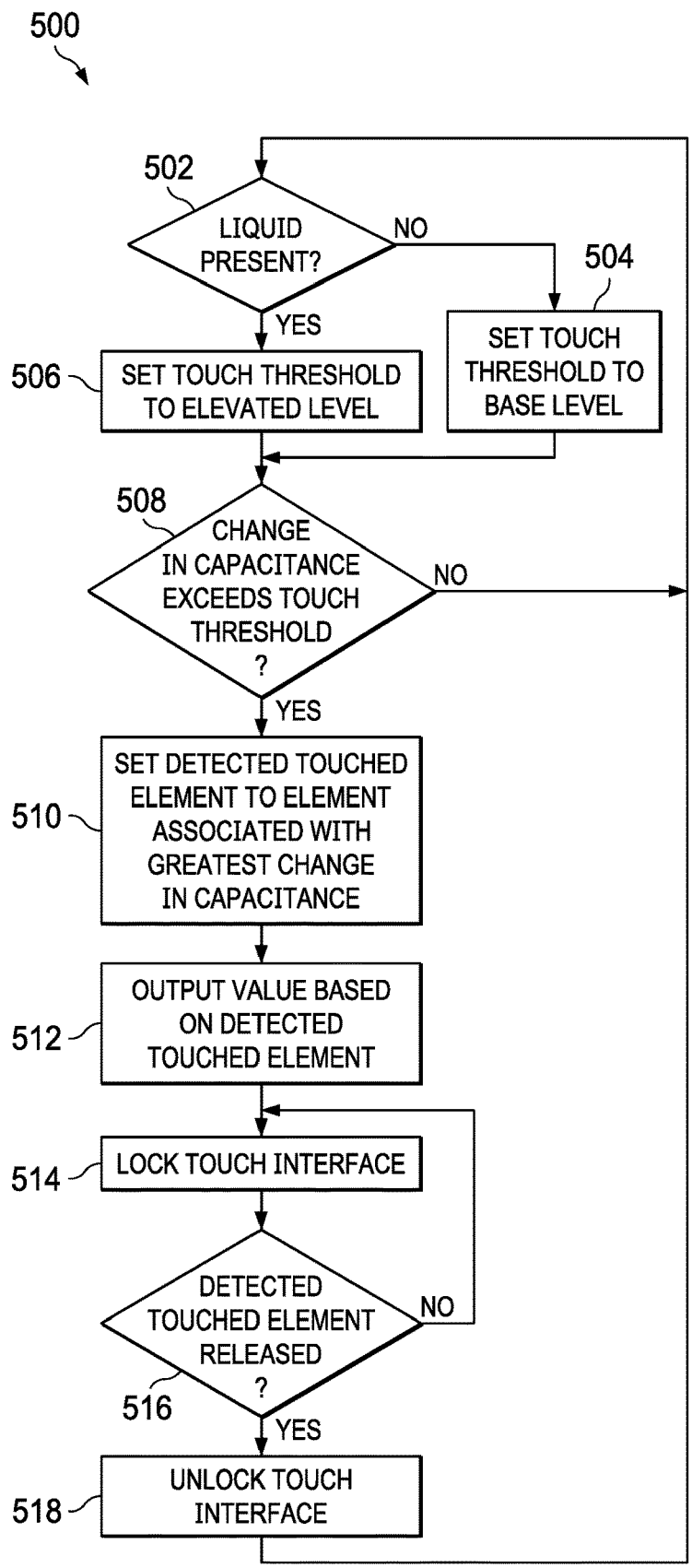
FIG. 5 is flowchart illustrating a method of detecting touches on a capacitive touch interface.

Referring to FIG. 5, a method 500 of detecting a touch in a capacitive touch system is illustrated. The method 500 may be performed by the controller 104 or by another controller in a capacitive touch system. While performing the method 500 the controller 104 or other controller periodically assesses capacitance values (e.g., changes in capacitance) associated with a plurality of elements (e.g., the plurality of electrodes 106). The method 500 includes determining whether liquid is present on a touch interface, at 502. For example, the controller 104 may determine whether liquid is present on the overlay 111. The controller 104 may determine that liquid is present on the overlay 111 in response to detecting concurrent touches of two or more of the buttons of the overlay 111 within a threshold period of time. For example, the controller 104 may determine that liquid is present on the overlay 111 in response to determining that the controller 104 detected a touch to both the first button 202 and the second button 204 at the same time within the last 5 minutes.

In response to determining that no liquid is present on the touch interface, the method 500 includes setting a touch threshold to a base level, at 504. In response to determining that liquid is present on the touch interface, the method 500 includes setting the touch threshold to an elevated level, at 506. The touch threshold corresponds to a capacitance change used by the capacitive touch system to determine whether a touch has occurred. For example, the controller 104 may set a touch threshold to 1 picofarad (pF) in response to determining that no liquid is present on the overlay 111. Alternatively, the controller 104 may set the touch threshold to 2 pF in response to determining that liquid is present on the overlay.

The method 500 further includes determining whether a change in capacitance associated with an electrode exceeds the touch threshold, at 508. For example, the controller 104 may determine whether a capacitance associated with any of plurality of electrodes 106 has changed by an amount that satisfies the touch threshold. In mutual mode examples, the capacitances associated with the plurality of electrodes 106 correspond to mutual capacitances between each of the plurality of electrodes 106 and the driven shield 110. Because the controller 104 uses an elevated touch threshold in response to determining that liquid is present on the overlay 111, a touch to a wet area of the overlay 111 outside of the plurality of buttons may be less likely to cause a capacitance change associated with one of the plurality of electrodes 106 that satisfies the touch threshold. Accordingly, false positives may be prevented. If no capacitance change associated with the monitored elements exceeds the touch threshold, the method 500 includes continuing to monitor the capacitance changes and revaluating the touch threshold, at 502.

The method 500 further includes setting a detected touched element to an element that is associated with a greatest change in capacitance among a plurality of monitored elements, at 510. For example, the controller 104 may set a detected touched electrode to an electrode of the plurality of electrodes 106 that is associated with a greatest change in capacitance among the plurality of electrodes 106. To illustrate, the controller 104 may set the detected touch electrode to the first electrode 106a in response to determining that the first electrode 106a is associated with a detected capacitance change greater than detected capacitance changes associated with the other electrodes in the plurality of electrodes 106. Because the controller 104 selects the electrode that is associated with a highest capacitance change among the plurality of electrodes 106 as the detected electrode, the controller 104 may avoid selecting an electrode that is associated with a capacitance change caused by liquid coupling a user's finger to the electrode.

The method 500 further includes outputting a value based on the detected touched element, at 512. For example, in response to determining that the first electrode 106a is the touched element, the controller 104 may output a value corresponding to the first button 202 associated with the first electrode 106a (e.g., "1"). In some implementations, the controller 104 may output the value to an electronic lock controller.

The method 500 further includes locking the touch interface, at 514, and determining whether detected capacitance values indicate that the detected touched element has been released, at 514. In response to determining that the detected touched element has not been released, the method 500 maintains the lock of the touch interface, at 514. In response to determining that the detected touched element has been released, the method 500 includes unlocking the touch interface, at 518, and continuing to monitor for detected touches. Thus, the method 500 may include disregarding capacitance values indicating detected touches to other elements until a determination that the detected touched element has been released. For example, after outputting a value corresponding to the first button 202 associated with the first electrode 106a, the controller 104 may lock the touch interface 102 until a determination that the first electrode 106a (or the first button 202) has been released. The controller 104 may not generate touch output in response to locking of the touch interface 102. Accordingly, the controller 104 may disregard (e.g., not generate output in response to) a detected touch associated with the second electrode 106b (or the second button 204) while the touch interface 102 is locked. Accordingly, the controller 104 may be prevented from outputting erroneous touch detection output as water flows across the overlay 111 altering capacitances of the plurality of electrodes 106. In response to detecting that the first electrode 106a (or the first button 202) has been released, the controller 104 may resume detecting touches.

Thus, the method 500 may reduce erroneous touch detection output by increasing a touch detection threshold in response to a presence of liquid, by identifying a touched element by determining which of a plurality of elements is associated with a greatest change in capacitance, and by locking touch detection output until a touched element is released. Accordingly, the method 500 may be used to improve accuracy of touch detection systems that are deployed outdoors where weather lead to exposure to liquid.

Figure 6:
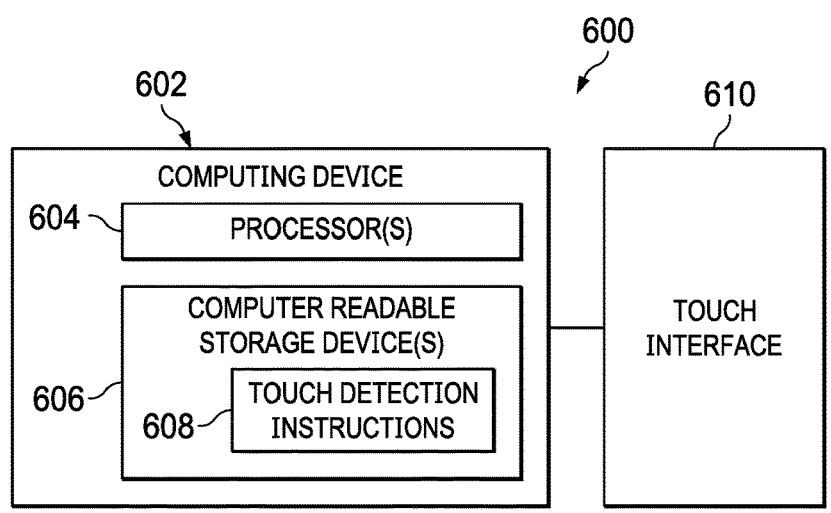
FIG. 6 is a block diagram of a computer system that may implement the touch detection techniques described herein.

Referring to FIG. 6 a block diagram of a computer system 600 that may detect touches according to the techniques described herein. The computer system 600 includes a computing device 602 and a touch interface 610. The computing device 602 may correspond to the controller 104 and may be included in a touch device, such as the touch device 200. The computing device 602 includes one or more processors 604 and one or more computer readable storage devices 606. The one or more processors 604 may include one or more CPUs, one or more GPUs, one or more other processors, or a combination thereof. The one or more computer readable storage devices 606 may include one or more read only memory (ROM) devices, one or more random access memory (RAM) devices, one or more disc drive devices, one or more other types of memory devices, or a combination thereof. The one or more computer readable storage devices 606 store touch detection instructions 608 that are executable by the one or more processors 604 to perform one or more of the functions described herein. For example, the touch detection instructions 608 may be executable by the one or more processors 604 to perform operations described herein with respect to FIGS. 1-3, the method 500, or a combination thereof. In particular, the touch detection instructions 608 may be executable by the one or more processors 604 to detect touches of the touch interface 610 according to the techniques and methods described herein. The touch interface 610 includes one or more capacitive touch elements (e.g., electrodes) and, in some examples, includes a driven shield, such as the driven shield 110.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An apparatus, comprising:
a touch interface comprising:
a plurality of electrodes; and
a shield device configured to:
establish a first mutual capacitive coupling with a first electrode of the plurality of electrodes; and
establish a second mutual capacitive coupling with a second electrode of the plurality of electrodes; and
a controller coupled to the touch interface, the controller configured to detect a touch based on a detected first capacitance value of the first mutual capacitive coupling and a detected second capacitance value of the second mutual capacitive coupling;
wherein the detected first capacitance value corresponds to a change in capacitance of the first mutual capacitive coupling between a charge phase and a transfer phase, and wherein the detected second capacitance value corresponds to a change in capacitance of the second mutual capacitive coupling between the charge phase and the transfer phase.

2. The apparatus of claim 1, wherein the shield device is positioned between and surrounds the first electrode and the second electrode in a plane.

3. The apparatus of claim 1, wherein the first electrode corresponds to a first button of a plurality of buttons of the touch interface, wherein the second electrode corresponds to a second button of the plurality of buttons of the touch interface, and wherein the controller is further configured to identify which of the buttons of the touch interface corresponds to the touch.

4. The apparatus of claim 3, wherein the controller is further configured to identify that the first button has been touched in response to determining that the detected first capacitance value is greatest among detected capacitance values associated with the plurality of electrodes.

5. The apparatus of claim 4, wherein the controller is further configured to:
lock the touch interface in response to detecting the touch; and
unlock the touch interface in response to detecting release of the first button.

6. The apparatus of claim 5, wherein the controller is configured to detect the touch in response to the detected first capacitance value, the detected second capacitance value, or a combination thereof satisfying a touch detection threshold.

7. The apparatus of claim 6, wherein the controller is configured to increase the touch detection threshold in response to detecting liquid on the touch interface.

8. The apparatus of claim 6, wherein the controller is configured to determine that liquid is present on the touch interface in response to determining that the detected first capacitance value and the second detected capacitance value indicate that multiple buttons of the touch interface have been touched concurrently.

9. A method comprises:
determining, at a controller, that liquid is present on a touch interface in response to capacitance values associated with a plurality of electrodes indicating that a first electrode of the plurality of electrodes and a second electrode of the plurality of electrodes were touched concurrently;
setting a touch detection threshold based on the determination of whether liquid is present on the touch interface; and
determining that the touch interface has been touched in response to determining that a change in capacitance associated with an electrode of a plurality of electrodes satisfying the touch detection threshold.

10. The method of claim 9, wherein setting the touch detection threshold based on the determination of whether liquid is present on the touch interface includes selecting an elevated threshold as the touch detection threshold in response to determining that liquid is present on the touch interface.

11. The method of claim 9, further comprising selecting a particular electrode of the plurality of electrodes as a detected touched electrode in response to determining that a change in capacitance associated with the particular electrode is greater than changes in capacitance associated with the other electrodes of the plurality of electrodes.

12. The method of claim 11, further comprising outputting a value associated with the particular electrode to an electronic lock controller.

13. The method of claim 11, further comprising:
locking the touch interface in response to detecting touch of the particular electrode; and
unlocking the touch interface in response to detecting release of the particular electrode.

14. A non-transitory computer readable storage device storing instructions executable by one or more processors to:
determine, at a controller, that liquid is present on a touch interface in response to capacitance values associated with a plurality of electrodes indicating that a first electrode of the plurality of electrodes and a second electrode of the plurality of electrodes were touched concurrently;
set a touch detection threshold based on the determination of whether liquid is present on the touch interface; and
determine that the touch interface has been touched in response to determining that a change in capacitance associated with an electrode of a plurality of electrodes satisfying the touch detection threshold.

15. The non-transitory computer readable storage device of claim 14, wherein setting the touch detection threshold based on the determination of whether liquid is present on the touch interface includes selecting an elevated threshold as the touch detection threshold in response to determining that liquid is present on the touch interface.

16. The non-transitory computer readable storage device of claim 14, wherein the instructions are further executable by the one or more processors to select a particular electrode of the plurality of electrodes as a detected touched electrode in response to determining that a change in capacitance associated with the particular electrode is greater than changes in capacitances associated with the other electrodes of the plurality of electrodes.

17. The non-transitory computer readable storage device of claim 16, wherein the instructions are further executable by the one or more processors to output a value associated with the particular electrode to an electronic lock controller.

* * * * *